United States Patent
Oda

(10) Patent No.: US 8,146,044 B2
(45) Date of Patent: Mar. 27, 2012

(54) METHOD OF DESIGNING A SEMICONDUCTOR DEVICE

(75) Inventor: Noriaki Oda, Ibaraki (JP)

(73) Assignee: Renesas Electronics Corporation, Kanagawa (JP)

( * ) Notice: Subject to any disclaimer, the term of this patent is extended or adjusted under 35 U.S.C. 154(b) by 499 days.

(21) Appl. No.: 12/164,391

(22) Filed: Jun. 30, 2008

(65) Prior Publication Data

US 2009/0007045 A1    Jan. 1, 2009

(30) Foreign Application Priority Data

Jun. 29, 2007    (JP) .................................. 2007-171482

(51) Int. Cl.
*G06F 17/50* (2006.01)
(52) U.S. Cl. ............ 716/132; 716/55; 716/101; 716/126
(58) Field of Classification Search .................... None
See application file for complete search history.

(56) References Cited

U.S. PATENT DOCUMENTS 6,795,800 B1 * 9/2004 Lee .................................. 703/2
2008/0281570 A1 * 11/2008 Joshi et al. ..................... 703/14

OTHER PUBLICATIONS

International Technology Roadmap for Semiconductors 2006 Edition.
N, Oda et al, "Chip-level Performance Maximization using ASIS (Application-specific Interconnect Structure) Wiring Design Concept for 45 nm CMOS Devices", 41.2 (2005).
N. Oda et al, "Chip-level Performance Maximization using ASIS (Application -specific Interconnect Structure), Wiring DEsign Concept for 45-nm CMOS Generation", IEICE TRns. Electron , vol. E90-C, No. 4 (Apr. 2007) p. 848-855.
Jan et al., "A 65nm Ultra Low Power Logic Platform Technology using Uni-axial Strained Silicon Transistsors", Int Electron Devices Meeting 3.4 (2005) p. 65-68.

* cited by examiner

*Primary Examiner* — Thuan Do
(74) *Attorney, Agent, or Firm* — Young & Thompson

(57) ABSTRACT

Aiming at providing a method of designing a semiconductor device capable of producing a semiconductor device which expresses performances adapted to required performances, the present invention sets a plurality of suites of device parameters, containing parameters relevant to transistor characteristics (transistor parameters) and parameters relevant to interconnect characteristics (interconnect parameters) corresponded to the transistor characteristics, for a single CMOS generation, selecting, out of the plurality of suites, a suite matched to performances required for a semiconductor to be designed, and designing the semiconductor device.

36 Claims, 5 Drawing Sheets

FIG. 2

| PRODUCT TARGET | | CASE A | | CASE B | | CASE C | |
|---|---|---|---|---|---|---|---|
| | | TRANSISTOR | INTERCONNECT | TRANSISTOR | INTERCONNECT | TRANSISTOR | INTERCONNECT |
| HIGH-PERFORMANCE MPU HIGH-PERFORMANCE LOGIC | | HP | THICK INTERCONNECT | HP | THICK INTERCONNECT | HP | THICK INTERCONNECT |
| MIDDLE-RANGE | SPEED PRIORITY | MR | MIDDLE-THICKNESS INTERCONNECT | MR | THIN INTERCONNECT | SPEED PRIORITY | THICK INTERCONNECT |
| | LOW POWER CONSUMPTION PRIORITY | | | | | LOW POWER CONSUMPTION PRIORITY | THIN INTERCONNECT |
| LOW-POWER-CONSUMPTION LSI | | LP | THIN INTERCONNECT | LP | THIN INTERCONNECT | LP | THIN INTERCONNECT |

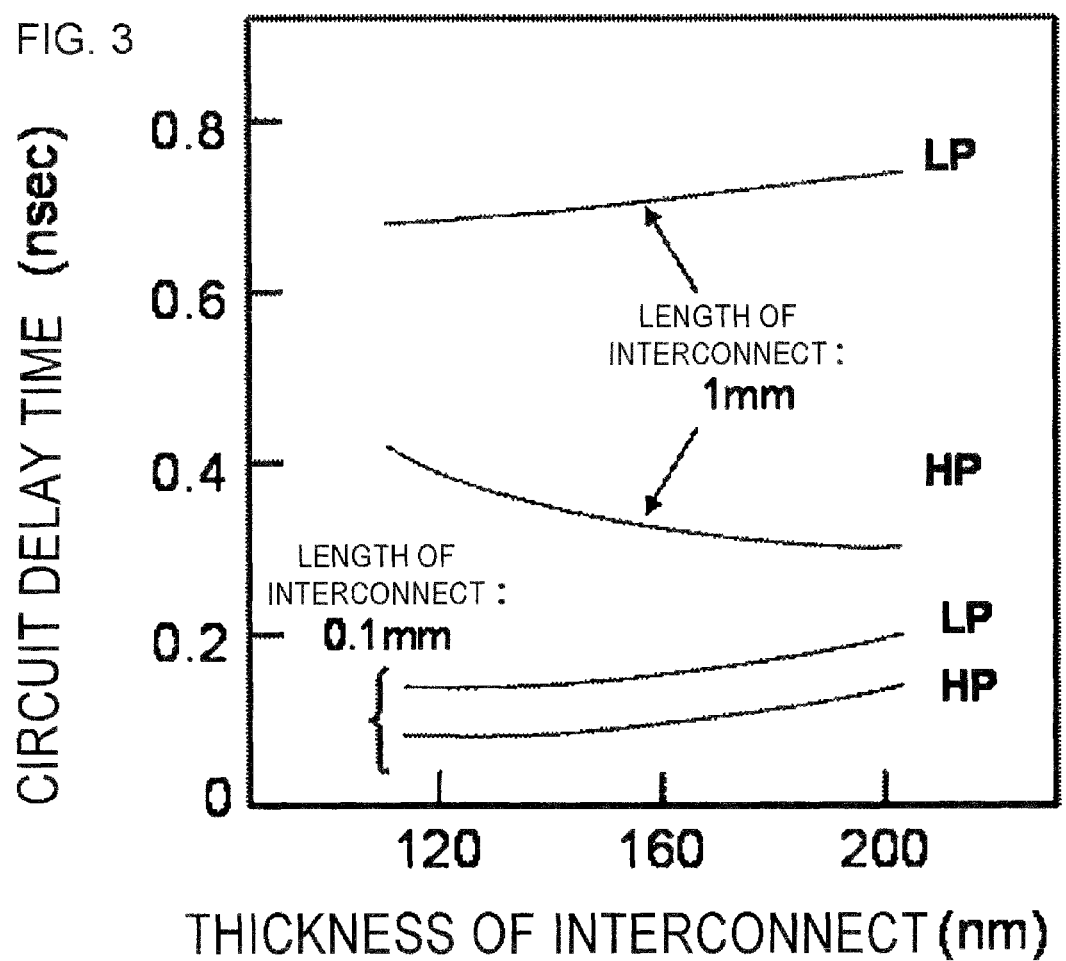

METHOD OF DESIGNING A SEMICONDUCTOR DEVICE

This application is based on Japanese patent application No. 2007-171482 the content of which is incorporated hereinto by reference.

BACKGROUND

Technical Field

The present invention relates to a method of designing a semiconductor device.

In conventional logic CMOS, a plurality of types of transistors, ranging from those of high-performance versions to low-power-consumption versions, have been prepared for a single CMOS generation, as being adapted to various target specifications of products, such as disclosed in International Technology Roadmap for Semiconductors 2006 Edition (Non-Patent Document 1); N. Oda et al., "Chip-level Performance Maximization using ASIS (Application-specific Interconnect Structure) Wiring Design Concept for 45-nm CMOS Devices", Int. Electron Devices Meeting 41.2 (2005) p. 1045 (Non-Patent Document 2); N. Oda et al., "Chip-level Performance Maximization using ASIS (Application-specific Interconnect Structure) Wiring Design Concept for 45-nm CMOS Generation", IEICE Trans. Electron, Vol. E90-C, No. 4 (2007) p. 848 (Non-Patent Document 3); and C. -H. Jan et al., "A 65-nm Ultra Low Power Logic Platform Technology using Uni-axial Strained Silicon Transistors", Int. Electron Devices Meeting 3.4 (2005) p. 65 (Non-Patent Document 4).

However, only one type of interconnect has been provided for the conventional products. FIG. 5 shows a graph plotting saturation ON-state current($I_{d,sat}$), as an index of transistor performance, with respect to the individual generations, based on description in Non-Patent Document 1. It is clearly shown that difference in performance between high-performance MPU (Micro Processing Unit) and low-power-consumption LSI steadily grows as the generation advances. In this situation, only a single structure of interconnect have been proposed for a single generation.

In such conventional design of interconnects of a semiconductor device, the interconnect structure determined so as to optimize performance of the high-performance MPU may result in increase in power consumption of the low-power-consumption LSI, and may even result in slow-down of circuit operation. In contrast, the interconnect structure determined as being targeted at the low-power-consumption LSI may result in only insufficient expression of performances of the high-performance MPU. In short, a non-conformity anticipated herein may be mismatching of the parameters relevant to transistor and the parameters relevant to interconnect, which may result in only insufficient performance of LSI chip as a whole. The performance mentioned herein means the total performance including operation speed of circuit, power consumption, chip size and reliability. This is because only a single interconnect design has been determined for each generation.

SUMMARY

According to the present invention, there is provided a method of designing a semiconductor device which includes: setting a plurality of suites of device parameters containing parameters relevant to transistor characteristics and parameters relevant to interconnect characteristics corresponded to the transistor characteristics for a single CMOS generation; and selecting, out of the plurality of suites, a suite matched to performances required for a semiconductor to be designed, and designing the semiconductor device.

In the method of designing a semiconductor device of the present invention, as the device parameters corresponded to a single CMOS generation, the parameters relevant to transistor characteristics, and parameters relevant to interconnect characteristics to be paired therewith, are preliminarily registered as one suite. The parameters relevant to interconnect characteristics are prepared in multiple ways per a single CMOS generation, similarly to the parameters relevant to transistor characteristics. Circuit is designed using these suites of device parameters.

By setting the parameters relevant to interconnect characteristics corresponded to the transistor characteristics, a semiconductor device which expresses performances adapted to required characteristics may be provided.

By setting the transistor characteristics and the interconnect characteristics as being combined into one suite, mismatching of the performances may be avoidable, and performances adapted to performances required for a semiconductor device may be realized.

According to the present invention, there is successfully provided a method of designing a semiconductor device which expresses performances adapted to required characteristics.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a drawing showing exemplary combinations of the transistor parameters and the interconnect parameters according to the first embodiment of a method of designing a semiconductor device of the present invention;

FIG. 3 is a drawing showing relations between thickness of interconnect and circuit delay time;

DETAILED DESCRIPTION

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Embodiments of the present invention will be explained below, referring to the attached drawings.

(First Embodiment)

Figure 1:
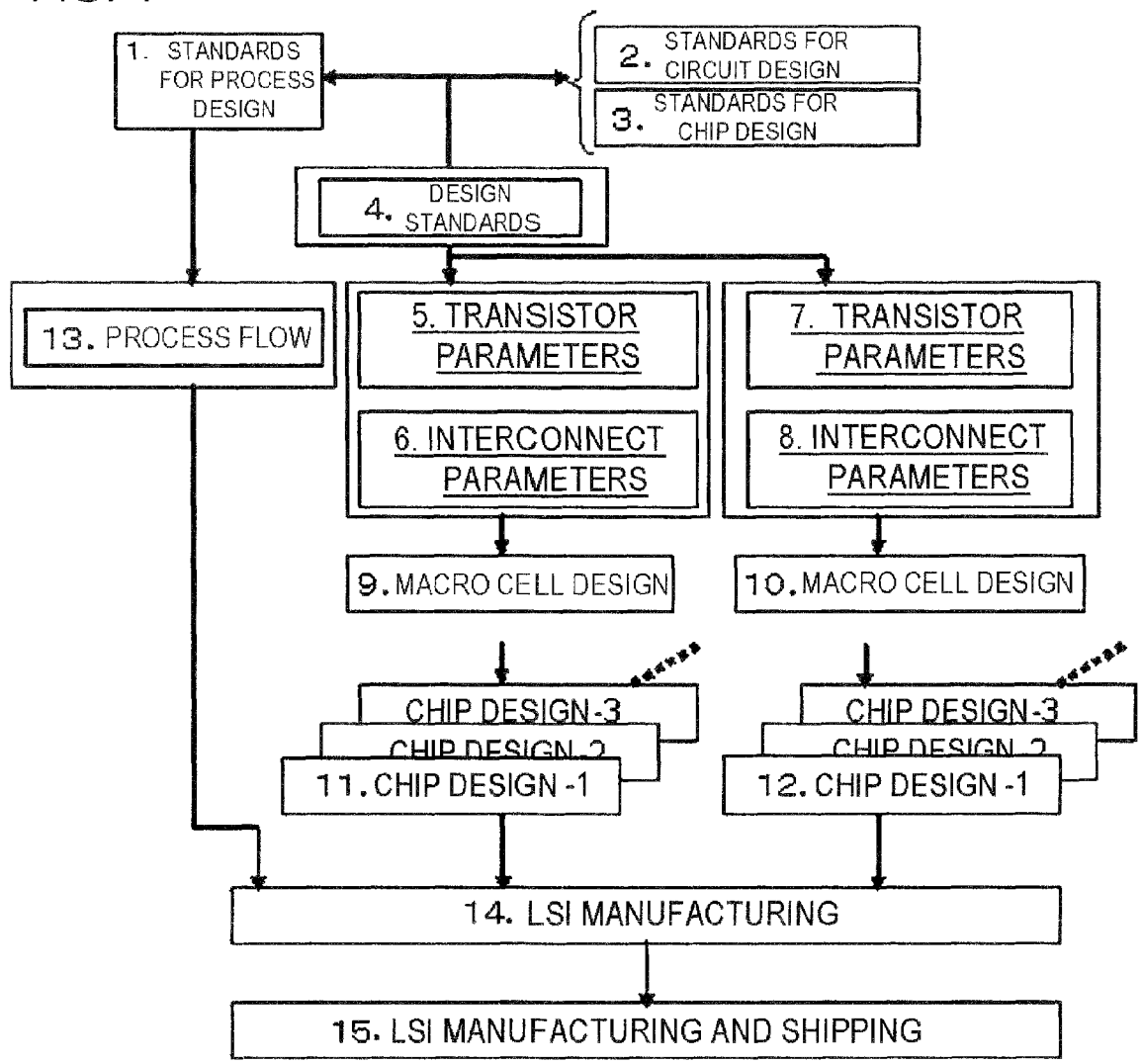
FIG. 1 is a design flow chart explaining a first embodiment of the semiconductor device.

FIG. 1 is a design flow chart of one CMOS generation showing a method of designing a semiconductor device of a first embodiment. An exemplary case of 45-nm generation will now be described.

A method of designing a semiconductor device of this embodiment is such as setting a plurality of groupings of device parameters containing parameters relevant to transistor characteristics and parameters relevant to interconnect characteristics corresponded to the transistor characteristics for a single CMOS generation; and selecting, out of the plurality of groupings, a suite matched to performances required for a semiconductor to be designed, and designing the semiconductor device.

The method of designing will be detailed below.

Standards for process design 1, standards for circuit design 2, and standards for chip design 3 are set, and based on them, design standards 4 are set. The standards for process design 1, the standards for circuit design 2, the standards for chip design 3, design standards 4, transistor parameters 5, 7 (parameters relevant to transistor characteristics), and interconnect parameters 6, 8 (parameters relevant to interconnect characteristics) are stored as data in a memory device, as being readable and writable at any time using a program.

The standards for process design 1, the standards for circuit design 2, the standards for chip design 3, and the design standards 4 will now be explained.

Standards for process design 1: Process-related specifications, such as types of apparatus used for the individual process steps, process conditions, standards for the individual processes, and characteristic standards of completed transistor, interconnect and so forth.

Standards for circuit design 2: Circuit design-related specifications, such as parameters used for configuring circuit, general width and pitch of interconnects of power source and grounding, types of transistors to be adopted (LP, HP, MP, high reliability version, etc.), and list of available macro cell and IP.

Standards for chip design 3: General specifications of chip.

Specifications determined in relation with final electric appliances, such as chip size, types of package, allowable range of operation temperature, size of bonding pads, pitch of bonding pads, and the number of interconnect layers.

Design standards 4: Specifications relevant to allowable range (including maximum and minimum values) of the individual dimensions drawn in the process of "mask design". For example, allowable range of individual dimensions of elements including transistor and interconnect, fabricated on a silicon substrate. More specifically, minimum gate length, minimum width of trench isolation, overlap length between trench end and gate end, size of contact, minimum line width, minimum space between interconnects, size of via hole, ratio of line width and space width.

Design standards 4 contain descriptions on dimension of transistor system, interconnect system and assembly system.

Thereafter, conforming to design standards 4, the transistor parameters 5 (parameters relevant to transistor characteristics) corresponded to a first product target (semiconductor device to be designed), and the parameters relevant to interconnect characteristics (interconnect parameters) 6 to be paired therewith are set. Also the transistor parameters (parameters relevant to transistor characteristics) 7 corresponded to a second product target (semiconductor device to be designed) and the parameters relevant to interconnect characteristics (interconnect parameters) 8 to be paired therewith are set. Based on these plurality of pairs of transistor parameters and interconnect parameters, macro cell design 9 corresponded to the first product target, and the macro cell design 10 corresponded to the second product target are executed. Using a macro cell completed by such plurality of macro cell designs, chip design 11 corresponded to the first product group, and the chip design 12 corresponded to the second product group are then executed. On the other hand, a process flow 13 is prepared, and LSI manufacturing 14 is executed using information thereof and a mask information output from the chip design. Output of the LSI manufacturing 14 is shipping of the LSI products.

Although an exemplary case of using two parameter suites was shown in this embodiment, a case of using three or more parameter suites are of course allowable.

As for configuration of the parameter pairs relevant to transistor characteristics and interconnect characteristics, a plurality of interconnect parameters may be corresponded to a single type of transistor parameters as shown in FIG. 2, or conversely, a plurality of transistor parameters may be corresponded to certain one interconnect parameter out of a plurality of interconnect parameters. In short, it is essential that the transistor parameters and the interconnect parameters are provided as suites, and that a plurality of interconnect parameters are provided.

In the cases shown in FIG. 2, thickness of local interconnect layer and intermediate interconnect layer is set larger for applications such as high-performance MPU (micro processing unit), and high-performance logic LSI for a single CMOS generation, and thickness of these interconnect layers is set smaller for LSIs required as being low in power consumption. For middle-range applications positioned therebetween, several choice options may reside. Interconnect having an intermediate thickness may be used as shown in case A, or thin interconnect may be used as shown in case B. In case B, also thick interconnect may be used. Moreover, as shown in case C, the middle-range products may further be divided into several product targets, and thickness of interconnect may be set corresponding to each of them.

For example, a general chip has second metal layer (M2) to seventh metal layer (M7) formed thereon. The metal layers M2 to M5 and the metal layers M6, M7 differ in pitch and thickness of interconnect by 2.5 times. Such difference in the thickness of interconnect for each layer is determined corresponding to pitch of interconnect.

What should be altered depending on applications of products is the thickness of interconnect corresponded to the pitch of interconnect. For example, assuming now that a 200-nm pitch is adopted to the metal layers M2 to M5 in a certain generation, the thickness of interconnect of the metal layers M2 to M5 may be set to 160 nm for high-performance transistors, whereas the thickness of interconnect may be set to 120 nm, while keeping the interconnect pitch unchanged, for low-power-consumption (LP) transistors. The interconnect parameters are obtained under thus varied thickness, by simulation or experiments. As a consequence, assuming now that the thickness of the interconnect is optimized for each product, and that a plurality of values of thickness are provided, it may be understood that even the products in the same generation will have a plurality of parameters.

In FIG. 2, the cases A, B and C correspond to different products.

In FIG. 2, the transistor parameters contain ON-state resistance, threshold voltage, gate capacitance (bottom surface component, side face component, edge component), source/drain resistance, junction capacitance, silicide electrode resistance, gate resistance, capacitance of source/drain diffusion layer (bottom surface component, side face component), capacitance of trench isolation, channel resistance, capacitance of bottom portion of channel (diffusion layer component, bottom surface component), contact resistance, and temperature coefficients of these characteristics, as being respectively adapted to high-performance (HP) transistor, middle-range (MR) transistor, and low-power-consumption (LP) transistor.

The interconnect parameters contain interconnect capacitance, interconnect resistance, via resistance, and temperature characteristics (temperature coefficients) of these interconnect capacitance, interconnect resistance, and via resistance.

The interconnect parameters contain parameters relevant to layers having the smallest interconnect pitch and the second smallest interconnect pitch, matched to performances required for a semiconductor device to be designed.

Dimensional design standards will not vary even if combination of the transistor parameters and the interconnect parameters varies, so that the same file for drawing macro cells and so forth may be selectable, but the device parameters corresponded to performance of the macro cells may vary. In practice, circuit layouting is executed using a draw file, and circuit design, evaluation of performance, and verification of circuit are executed using the device parameters.

In the first embodiment, a plurality of parameter suites composed of the transistor characteristics and the interconnect characteristics, adapted to the first product target and the second product target, are prepared as the device parameters, so that the individual product targets may have delay characteristics and power consumption characteristics suitable thereto. The embodiment may most specifically be characterized by that a plurality of parameters relevant to the interconnect characteristics are prepared for a single CMOS generation.

In this embodiment, the thickness of interconnect layer is set larger for applications such as high-performance MPU (micro processing unit), and high-performance logic LSI for a single CMOS generation, and is set smaller for LSIs required as being low in power consumption. Effect of this configuration will be shown in FIG. 3. FIG. 3 plots interconnect thickness dependence of the circuit delay time of a 2-input NAND circuit with interconnect load, while being parameterized by the characteristics of transistors which drive the circuit. The CMOS generation shown herein is 45-nm generation (interconnect pitch=140 nm), and length of interconnect is 1 mm. It is found from the graph that, in view of circuit delay time, thick interconnect may preferably used for high-performance MPU, and thin interconnect may preferably used for low-power-consumption LSI. Also in view of power consumption, making difference in the thickness of interconnect successfully reduced interconnect capacitance, and consequently reduced the active power by approximately 20%.

Any modification and control of the thickness of interconnect in this embodiment may be made only among the layers based on the same minimum design rule, such as among the local interconnect layers, and among the intermediate interconnect layers.

Back annotation often required for LSI design may be executed in the stage of chip design (chip design 11 corresponded to the first product group, chip design 12 corresponded to the second product group). This is effective also in that the number of feedback may be reduced as compared with the case where a united interconnect parameter is used, because appropriate device parameters may be set as being adapted to the product target.

(Second Embodiment)

Figure 4:
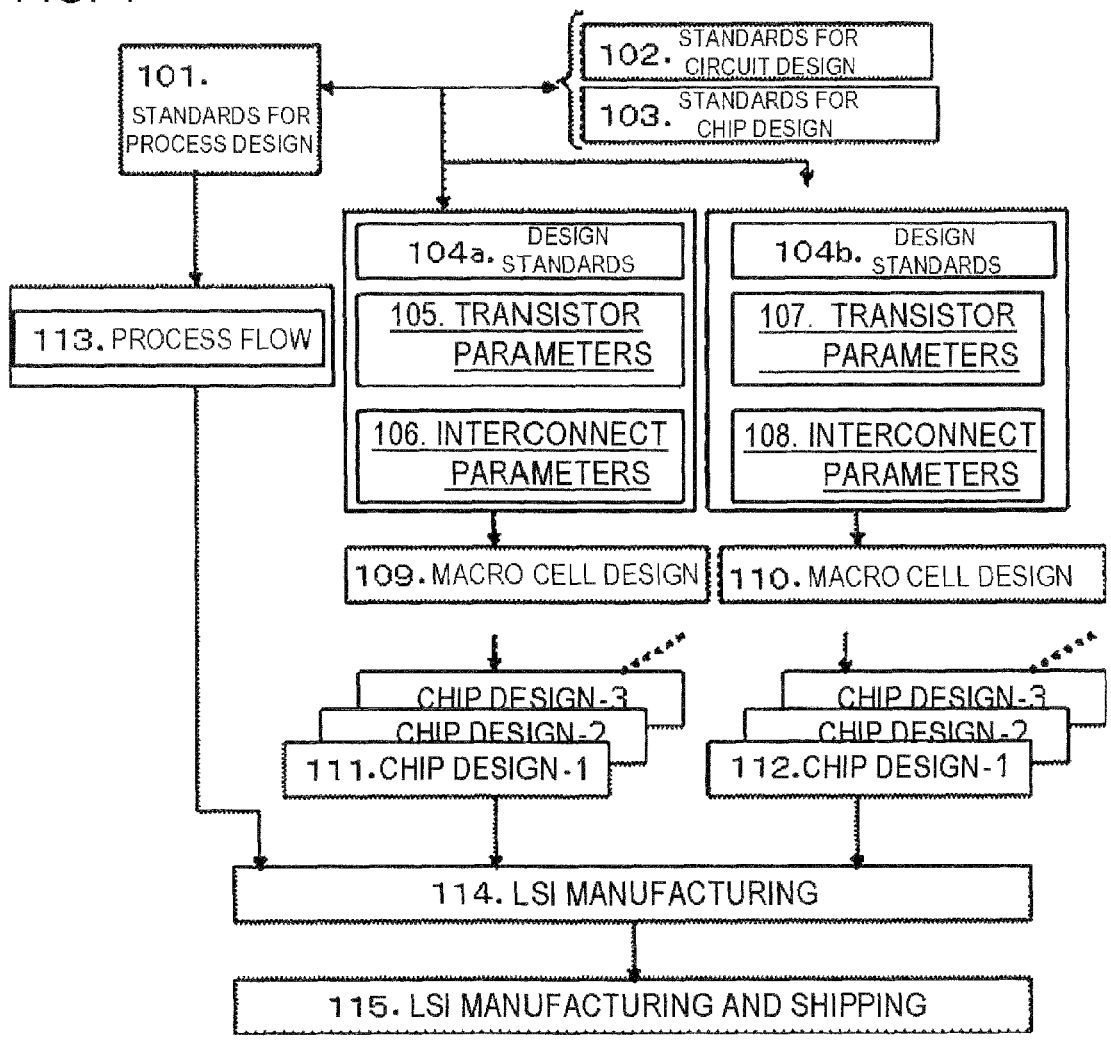
FIG. 4 is a design flow chart explaining a second embodiment of the present invention.
Figure 5:
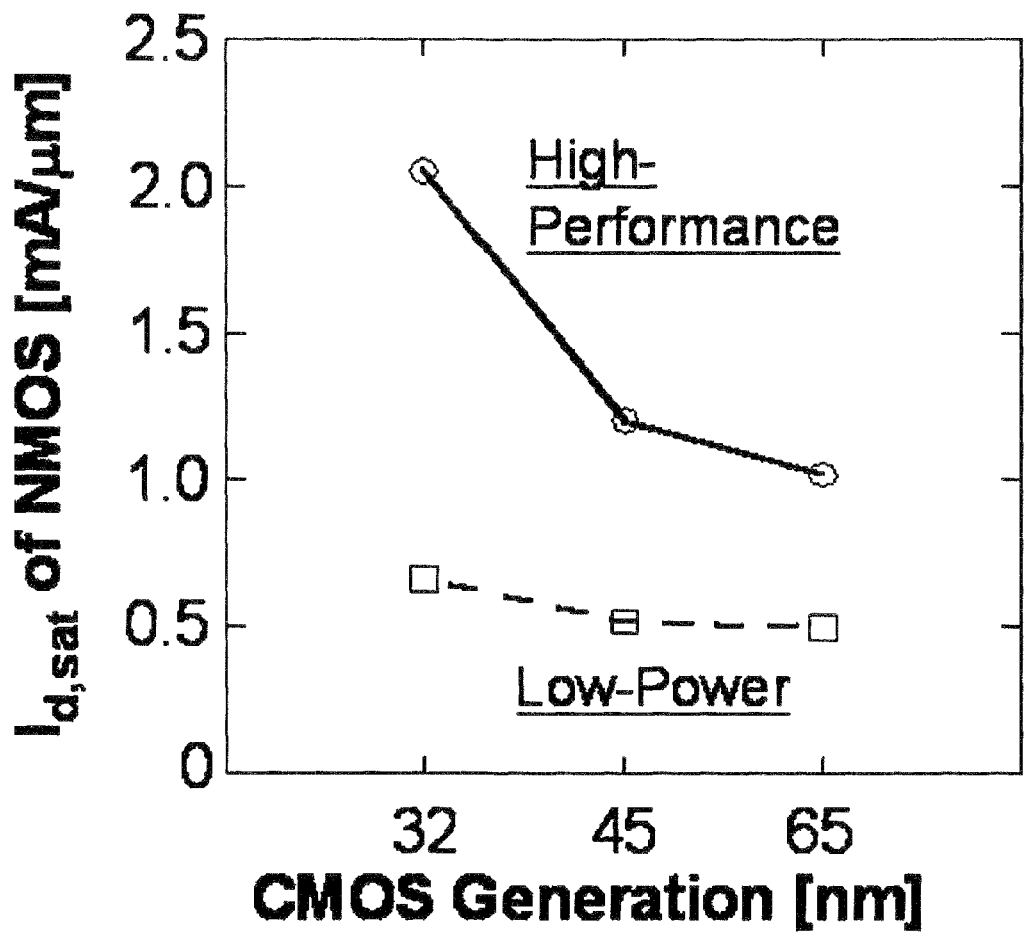
FIG. 5 is a drawing showing relations between CMOS generation and saturation ON-state current.

A second embodiment of the present invention will be shown. FIG. 4 is a design flow showing the second embodiment of the present invention. This embodiment differs from the first embodiment in that, not only the individual device parameters relevant to transistor and interconnect, but also the design standards are set in multiple ways depending on applications. Expressing now using the reference numerals in the drawing, a certain product target may be realized based on a combination of design standards 104*a*, transistor parameters 105 and interconnect parameters 106. Another product target may be realized based on a combination of design standards 104*b*, transistor parameters 107 and interconnect parameters 108.

In FIG. 4, reference numeral 101 represents process design standards, 102 represents standards for circuit design, and 103 represents standards for chip design. Reference numerals 109, 110 represent macro cell designs, 111, 112 represent chip designs, 113 represents process flow, 114 represents LSI manufacturing, and 115 represents shipping of LSI products.

The present invention is not limited to the above-described embodiments. Any modification, improvement and so forth may be included within the scope of the present invention, so far as the object of the present invention may be attainable.

For example, the number of local interconnect layers, intermediate interconnect layers, semi-global interconnect layers and global interconnect layers may be provided in multiple ways for a single transistor parameters.

It is apparent that the present invention is not limited to the above embodiment, that may be modified and changed without departing from the scope and spirit of the invention.

What is claimed is:

1. A method of designing a semiconductor device using data stored in a memory device and being readable using a program, comprising:
    setting a plurality of device parameters containing transistor characteristic parameters and interconnect characteristic parameters corresponded to the transistor characteristic parameters for a single CMOS generation using said stored data in said memory device; and
    selecting, out of said plurality of device parameters, a grouping matched to performances required for a semiconductor to be designed, and designing said semiconductor device,
    wherein said interconnect characteristic parameters contain interconnect capacitance, interconnect resistance of each layer of a multi-layered interconnect, and via hole resistance, matched to performances required for a semiconductor device to be designed.

2. The method of designing a semiconductor device as claimed in claim 1, wherein said semiconductor device is a logic LSI.

3. The method of designing a semiconductor device as claimed in claim 1, wherein said transistor characteristic parameters contain ON-state resistance, threshold voltage, gate capacitance, source/drain resistance, junction capacitance, and silicide electrode resistance, matched to performances required for a semiconductor device to be designed.

4. The method of designing a semiconductor device as claimed in claim 1, wherein said transistor characteristic parameters are composed of a combination of parameters relevant to a plurality of transistors using a plurality of levels of source voltage.

5. The method of designing a semiconductor device as claimed in claim 1, further comprising:
    designing a plurality of macro cells having specific functions using a group from said plurality of device parameters of said transistor characteristic parameters and said interconnect characteristic parameters, arranging said plurality of macro cells on a semiconductor chip, and connecting said macro cells using interconnects.

6. The method of designing a semiconductor device as claimed in claim 5, wherein the group from said plurality of device parameters includes the interconnect characteristic parameters of the interconnects connecting said macro cells are set for a single CMOS generation.

7. The method of designing a semiconductor device as claimed in claim 1, wherein said transistor characteristic parameters include temperature coefficients of the individual characteristics of ON-state resistance, threshold voltage, gate capacitance, source/drain resistance, junction capacitance, and silicide electrode resistance.

8. The method of designing a semiconductor device as claimed in claim 1, wherein said interconnect characteristic parameters contain, grouping-by-grouping, values of interconnect capacitance and interconnect resistance corresponded to different values of thickness of interconnects.

9. The method of designing a semiconductor device as claimed in claim 1, wherein said interconnect characteristic parameters contain, grouping-by-grouping, different configuration of interconnect layers, and values of interconnect capacitance and interconnect resistance corresponded to the number of layers.

10. The method of designing a semiconductor device as claimed in claim 1, wherein said interconnect characteristic parameters contain parameters relevant to a layer having the smallest interconnect pitch, matched to performances required for a semiconductor device to be designed.

11. The method of designing a semiconductor device as claimed in claim 1, wherein said interconnect characteristic parameters contain parameters relevant to a layer having the second smallest interconnect pitch, matched to performances required for a semiconductor device to be designed.

12. The method of designing a semiconductor device as claimed in claim 1, wherein said interconnect characteristic parameters contain parameters relevant to layers having the smallest interconnect pitch and the second smallest interconnect pitch, matched to performances required for a semiconductor device to be designed.

13. A method of designing a semiconductor device using data stored in a memory device and being readable using a program, comprising:
setting a plurality of device parameters containing transistor characteristic parameters and interconnect characteristic parameters corresponded to the transistor characteristic parameters for a single CMOS generation using said stored data in said memory device; and
selecting, out of said plurality of device parameters, a grouping matched to performances required for a semiconductor to be designed, and designing said semiconductor device,
wherein said interconnect characteristic parameters include capacitance and resistance of each layer of local interconnect, intermediate interconnect, semi-global interconnect and global interconnect, and resistance of viaholes connecting the individual interconnect layer.

14. The method of designing a semiconductor device as claimed in claim 13, wherein said semiconductor device is a logic LSI.

15. The method of designing a semiconductor device as claimed in claim 13, wherein said transistor characteristic parameters contain ON-state resistance, threshold voltage, gate capacitance, source/drain resistance, junction capacitance, and silicide electrode resistance, matched to performances required for a semiconductor device to be designed.

16. The method of designing a semiconductor device as claimed in claim 13, wherein said transistor characteristic parameters are composed of a combination of parameters relevant to a plurality of transistors using a plurality of levels of source voltage.

17. The method of designing a semiconductor device as claimed in claim 13, further comprising:
designing a plurality of macro cells having specific functions using a group from said plurality of device parameters of said transistor characteristic parameters and said interconnect characteristic parameters, arranging said plurality of macro cells on a semiconductor chip, and connecting said macro cells using interconnects.

18. The method of designing a semiconductor device as claimed in claim 17, wherein the group from said plurality of device parameters includes the interconnect characteristic parameters of the interconnects connecting said macro cells are set for a single CMOS generation.

19. The method of designing a semiconductor device as claimed in claim 13, wherein said transistor characteristic parameters include temperature coefficients of the individual characteristics of ON-state resistance, threshold voltage, gate capacitance, source/drain resistance, junction capacitance, and silicide electrode resistance.

20. The method of designing a semiconductor device as claimed in claim 13, wherein said interconnect characteristic parameters contain, grouping-by-grouping, values of interconnect capacitance and interconnect resistance corresponded to different values of thickness of interconnects.

21. The method of designing a semiconductor device as claimed in claim 13, wherein said interconnect characteristic parameters contain, grouping-by-grouping, different configuration of interconnect layers, and values of interconnect capacitance and interconnect resistance corresponded to the number of layers.

22. The method of designing a semiconductor device as claimed in claim 13, wherein said interconnect characteristic parameters contain parameters relevant to a layer having the smallest interconnect pitch, matched to performances required for a semiconductor device to be designed.

23. The method of designing a semiconductor device as claimed in claim 13, wherein said interconnect characteristic parameters contain parameters relevant to a layer having the second smallest interconnect pitch, matched to performances required for a semiconductor device to be designed.

24. The method of designing a semiconductor device as claimed in claim 13, wherein said interconnect characteristic parameters contain parameters relevant to layers having the smallest interconnect pitch and the second smallest interconnect pitch, matched to performances required for a semiconductor device to be designed.

25. A method of designing a semiconductor device using data stored in a memory device and being readable using a program, comprising:
setting a plurality of device parameters containing transistor characteristic parameters and interconnect characteristic parameters corresponded to the transistor characteristic parameters for a single CMOS generation using said stored data in said memory device; and
selecting, out of said plurality of device parameters, a grouping matched to performances required for a semiconductor to be designed, and designing said semiconductor device,
wherein said interconnect characteristic parameters include temperature coefficients of the individual characteristics of interconnect capacitance, interconnect resistance, and via hole resistance.

26. The method of designing a semiconductor device as claimed in claim 25, wherein said semiconductor device is a logic LSI.

27. The method of designing a semiconductor device as claimed in claim 25, wherein said transistor characteristic parameters contain ON-state resistance, threshold voltage, gate capacitance, source/drain resistance, junction capacitance, and silicide electrode resistance, matched to performances required for a semiconductor device to be designed.

28. The method of designing a semiconductor device as claimed in claim 25, wherein said transistor characteristic parameters are composed of a combination of parameters relevant to a plurality of transistors using a plurality of levels of source voltage.

29. The method of designing a semiconductor device as claimed in claim 25, further comprising:
    designing a plurality of macro cells having specific functions using a group from said plurality of device parameters of said transistor characteristic parameters and said interconnect characteristic parameters, arranging said plurality of macro cells on a semiconductor chip, and connecting said macro cells using interconnects.

30. The method of designing a semiconductor device as claimed in claim 29, wherein the group from said plurality of device parameters includes the interconnect characteristic parameters of the interconnects connecting said macro cells are set for a single CMOS generation.

31. The method of designing a semiconductor device as claimed in claim 25, wherein said transistor characteristic parameters include temperature coefficients of the individual characteristics of ON-state resistance, threshold voltage, gate capacitance, source/drain resistance, junction capacitance, and silicide electrode resistance.

32. The method of designing a semiconductor device as claimed in claim 25, wherein said interconnect characteristic parameters contain, grouping-by-grouping, values of interconnect capacitance and interconnect resistance corresponded to different values of thickness of interconnects.

33. The method of designing a semiconductor device as claimed in claim 25, wherein said interconnect characteristic parameters contain, grouping-by-grouping, different configuration of interconnect layers, and values of interconnect capacitance and interconnect resistance corresponded to the number of layers.

34. The method of designing a semiconductor device as claimed in claim 25, wherein said interconnect characteristic parameters contain parameters relevant to a layer having the smallest interconnect pitch, matched to performances required for a semiconductor device to be designed.

35. The method of designing a semiconductor device as claimed in claim 25, wherein said interconnect characteristic parameters contain parameters relevant to a layer having the second smallest interconnect pitch, matched to performances required for a semiconductor device to be designed.

36. The method of designing a semiconductor device as claimed in claim 25, wherein said interconnect characteristic parameters contain parameters relevant to layers having the smallest interconnect pitch and the second smallest interconnect pitch, matched to performances required for a semiconductor device to be designed.

* * * * *